United States Patent
Kumasaka et al.

[19]

[11] Patent Number: 5,847,490
[45] Date of Patent: Dec. 8, 1998

[54] PIEZOELECTRIC TRANSFORMER WRAPPED BY WRAPPING MEMBER OF SOFT INSULATING SHEET MATERIAL

[75] Inventors: Katsunori Kumasaka; Masafumi Katsuno; Koichi Okamoto; Yoshiaki Fuda, all of Miyagi, Japan

[73] Assignee: Tokin Corporation, Miyagi, Japan

[21] Appl. No.: 879,127

[22] Filed: Jun. 19, 1997

[30] Foreign Application Priority Data

Jun. 21, 1996 [JP] Japan ..................................... 8-162242

[51] Int. Cl.$^6$ ..................................................... H01L 41/08
[52] U.S. Cl. ........................ 310/348; 310/327; 310/340; 310/345; 310/359
[58] Field of Search ..................................... 310/326, 327, 310/340, 345, 348, 359, 364, 366, 363, 337

[56] References Cited

U.S. PATENT DOCUMENTS

| | | | |
|---|---|---|---|
| 2,518,883 | 8/1950 | Gravley | 310/340 |
| 2,794,132 | 5/1957 | Zapponi | 310/340 |
| 3,622,813 | 11/1971 | Kumon | 310/345 |
| 3,851,194 | 11/1974 | Kawada | 310/345 |
| 4,028,646 | 6/1977 | Ikushima et al. | 310/340 X |
| 4,212,220 | 7/1980 | Helpinstill, II | 310/340 X |
| 4,392,074 | 7/1983 | Kleinschmidt et al. | 310/327 |
| 4,629,928 | 12/1986 | Hamada et al. | 310/365 |
| 4,637,246 | 1/1987 | Lombard et al. | 310/363 X |
| 4,727,634 | 3/1988 | Fishman | 310/363 X |
| 5,646,470 | 7/1997 | de Groot | 310/337 |

FOREIGN PATENT DOCUMENTS

0 414 138 A2  2/1991  European Pat. Off. .
06 326371  11/1994  Japan .

*Primary Examiner*—Mark O. Budd
*Attorney, Agent, or Firm*—Hopgood, Calimafde, Kalil & Judlowe

[57] ABSTRACT

A piezoelectric transformer element is wrapped together with primary lead members and secondary lead members by a thin soft insulating sheet, with the primary and secondary lead members being exposed outside the wrapping sheet, so that the transformer element is small in size, and easy in handling, and mounting operation on a circuit board. The primary and secondary lead members can be formed of a flexible flat cable. In an electric power supply device using the piezoelectric transformer element, the transformer element, and the flexible flat cable are wrapped by the wrapping sheet together with a portion of a circuit board on which the transformer element and other circuit elements are mounted.

19 Claims, 7 Drawing Sheets

PIEZOELECTRIC TRANSFORMER WRAPPED BY WRAPPING MEMBER OF SOFT INSULATING SHEET MATERIAL

BACKGROUND OF THE INVENTION

The present invention relates to a piezoelectric transformer device using a piezoelectric vibrator and, in particular, to such a piezoelectric transformer device and an electric power supply device using the piezoelectric transformer device.

As is known in the prior art, the piezoelectric vibrator used in the piezoelectric transformer has at least one pair of drive electrodes formed on and/or in a piezoelectric-ceramic plate. When an AC voltage is applied to the pair of drive electrodes, the plate vibrates due to the piezoelectric effect with a resonant mode such as a single wavelength resonant mode. When the plate is vibrating, variation of voltage potential is generated at any position of the plate. The variable voltage potential can be taken out from an output electrode formed on the position. A pair of output electrodes can be formed at different positions on the plate. Thus, the AC voltage applied to the drive electrodes as primary electrodes is transformed and is obtained at the output electrodes as secondary electrodes.

Since it is important for the piezoelectric transformer that the piezoelectric plate vibrates, it is a serious problem to support the transformer without suppression of the vibration. A waveform of the vibration has vibration nodes and antinodes.

On the other hand, leads must be required to apply the input voltage to the primary electrodes and take out the transformed voltage from the secondary electrodes. Usually, lead wires are connected to the primary electrodes and the secondary electrodes. However, the lead connection points are not always at positions corresponding to the vibration nodes. The lead wires should be free without tension so as to interfere the vibration of the piezoelectric plate. The lead wires are troublesome for assembling, maintenance and other deal in an electrical circuit device, especially, a small size device.

Further, the primary and secondary electrodes are formed on different surfaces of the piezoelectric plate. Therefore, mounting and wiring operation of the transformer on a circuit board is complex. This results in large space for mounting the transformer on the circuit board and also in a high cost and large size of the circuit device.

In the prior art, the piezoelectric transformer element is contained in an insulating cover case together with lead wires for the purpose of easy and safe handling of the transformer, insulation of it from wiring pattern on a printed circuit board, and other purpose. The cover case is usually made of plastic resin and has a wall thickness of 0.5 mm or more. The use of the case makes the transformer device and a power supply device using the piezoelectric transformer device expensive and large in size.

SUMMARY OF THE INVENTION

Therefore, it is an object of the present invention to provide the piezoelectric transformer device which is simple in an outer insulating structure, small in the size, low in the cost, and easy in handling and assembling operation.

It is another object of the present invention to provide an electric power supply device using the piezoelectric transformer device which is easy assembling operation, small in size, low in the cost, and high in reliability.

According to the present invention, there is provided a piezoelectric transformer device which comprises a piezoelectric transformer element comprising a piezoelectric rectangular plate having an input region and an output region, primary electrode means formed on the input region of the rectangular plate for receiving a driving voltage as a primary voltage to drive vibration of the rectangular plate by the piezoelectric effect, and secondary electrode means formed on the output region of the rectangular plate for taking out a secondary voltage generated by the vibration of the rectangular plate due to the piezoelectric effect; primary lead means connected to the primary electrode means for feeding the driving voltage to the primary electrode means; secondary lead means connected to the secondary electrode means for leading out the secondary voltage; and wrapping means of soft insulating sheet material wrapping and grasping the piezoelectric transformer element, the primary lead means, and the secondary lead means together therein, the primary lead means and the secondary lead means being led out of the cover sheet.

According to the present invention, an electric power supply device is also obtained which comprises a piezoelectric transformer device, other circuit elements to be connected to the piezoelectric transformer device, and a circuit board having a transformer region on which the piezoelectric transformer device is mounted, an adjacent region on which the other circuit elements are mounted, and a wiring pattern formed thereon to connect the piezoelectric transformer device with the other circuit elements. The piezoelectric transformer comprises a piezoelectric transformer element comprising a piezoelectric rectangular plate having an input region and an output region, primary electrode means formed on the input region of the rectangular plate for receiving a driving voltage as a primary voltage to drive vibration of the rectangular plate by the piezoelectric effect, and secondary electrode means formed on the output region of the rectangular plate for taking out a secondary voltage generated by the vibration of the rectangular plate due to the piezoelectric effect; primary lead means connected to the primary electrode means for feeding the driving voltage to the primary electrode means, the primary lead means being connected to the wiring pattern; and secondary lead means connected to the secondary electrode means for leading out the secondary voltage, the secondary lead means also being connected to the wiring pattern.

The electric power supply device further comprises wrapping means of soft insulating sheet material wrapping and grasping the piezoelectric transformer element, the primary lead means, the secondary lead means, and the transformer region of the circuit board together therein.

The other objects, and various embodiments and modifications of the present invention will be described herein below and in the dependent claims hereafter.

DESCRIPTION OF PREFERRED EMBODIMENTS

Prior to description of best mode for carrying out the present invention, the prior art will be described with reference to FIGS. 1 through 4 so as to facilitate the better understanding of the present invention.

Figure 1:
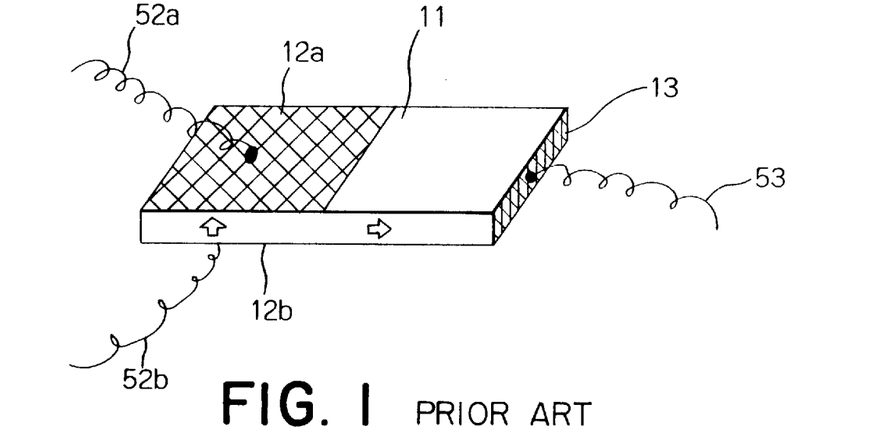
FIG. 1 is a perspective view of an example of a known piezoelectric transformer.

Referring to FIG. 1, a known piezoelectric transformer shown therein comprises a rectangular plate 11 of a piezoelectric-ceramic material, a pair of primary electrodes 12a and 12b, and a secondary electrode 13 formed on an end surface of the plate 11.

As the piezoelectric-ceramic materials used in the piezoelectric transformer, there are known ceramics of Pb(FeNb)ZrTiO$_3$ type, Pb(MnSb)ZrTiO$_3$ type, Pb(MnNb)ZrTiO$_3$ type, Pb(FeSb)ZrTiO$_3$ type, and the like.

The primary electrodes 12a and 12b are formed on the opposite surfaces of a right half portion (as viewed in the figure) of the plate 11. The half portion of the plate 11 is polarized in the thickness direction as shown by an arrow.

Figure 4:
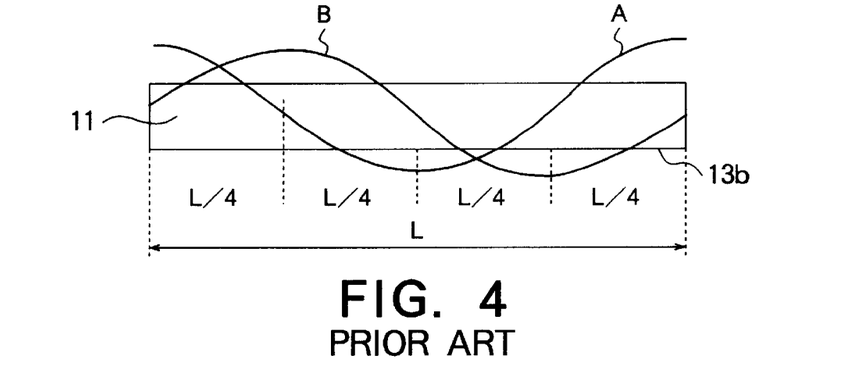
FIG. 4 is a diagrammatic view illustrating vibration of a piezoelectric plate.

The piezoelectric-ceramic rectangular plate 11 with the primary electrodes 12a and 12b is known as a piezoelectric vibrating element. In detail, when an AC voltage is applied across the pair of primary electrodes 12a and 12b, the plate 11 vibrates with a wavelength equal to the length L of the plate 11 as shown in FIG. 4 where two waveforms A and B are shown as displacement distribution and a strain distribution of the plate, respectively. Vibration nodes and anti-nodes are alternately present at intervals of L/4. The primary electrodes 12a and 12b are rather referred to as drive electrodes in the vibrating element.

Returning to FIG. 1, the other half portion of the plate 11 is polarized in the lengthwise direction as shown by another arrow. When the piezoelectric-ceramic plate 11 vibrates, an AC voltage is resulted from the secondary electrode 13.

Thus, when an AC voltage is applied to the primary electrodes 12a and 12b, a secondary output voltage is obtained from the secondary electrode 13. One of the primary electrodes 12a and 12b, for example, electrode 12b is used in common for the secondary side, that is, the secondary output is obtained across the primary electrode 12b and secondary electrode 13.

In order to apply the primary voltage to the primary electrodes 12a and 12b, input lead wires 53a and 52b are connected to the primary electrodes 12a and 12b at vibration nodes, respectively, by soldering method. On the other hand, an output lead wire 53 is also connected to the secondary electrode 13 by soldering method.

Figure 2:
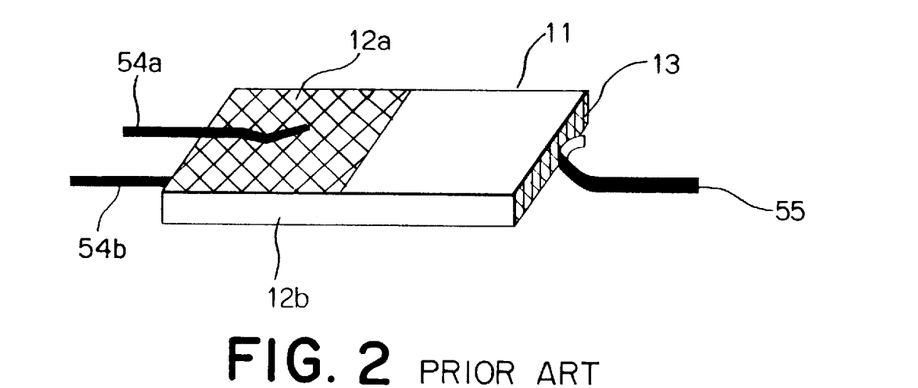
FIG. 2 is a perspective view of another example of a known piezoelectric transformer.
Figure 3:
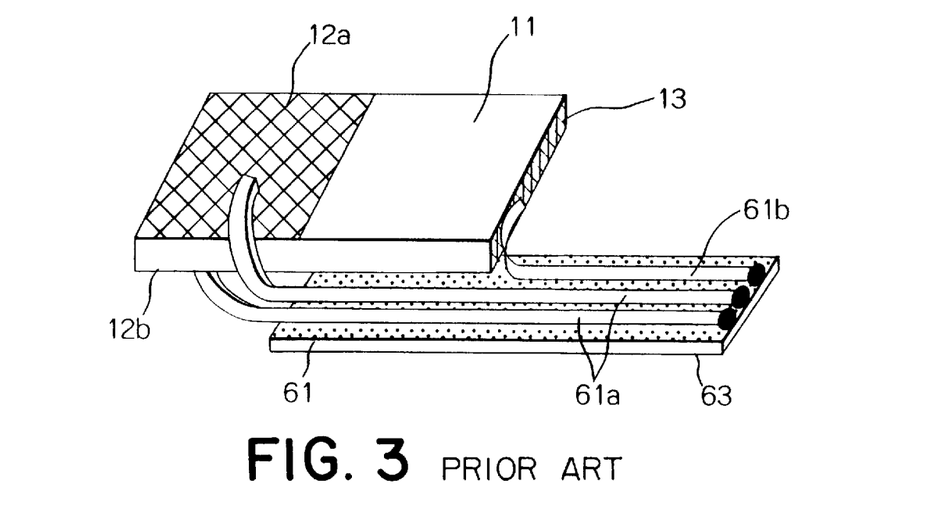
FIG. 3 is a perspective view of another example of a known piezoelectric transformer.

There are also known other structures for connecting input leads and output lead to the primary electrodes 12a and 12b and the secondary electrode 13, respectively, as shown in FIGS. 2 and 3.

Referring to FIG. 2, elastic conductor ribbons 54a and 54b and 55 are used in place of wires and are connected to the primary electrodes 12a and 12b and secondary electrode 13 by soldering method or pressure welding method.

Referring to FIG. 3, a flexible flat cable 61 is used in place of the lead wires and elastic conductor ribbons. The flexible flat cable 61 comprises conductor strips 61a and 61b deposited or formed on a flexible plastic sheet 63. End portions of conductor strips 61a and 61b are led out from the flexible plastic sheet 61 and are connected to the primary electrodes 12a and 12b and secondary electrode 13 by soldering method or pressure welding.

Those transformers known in the prior art have problems as described in the preamble.

Now, best mode for carrying out the present invention will be described with reference to FIGS. 5 through 16.

Figure 5:
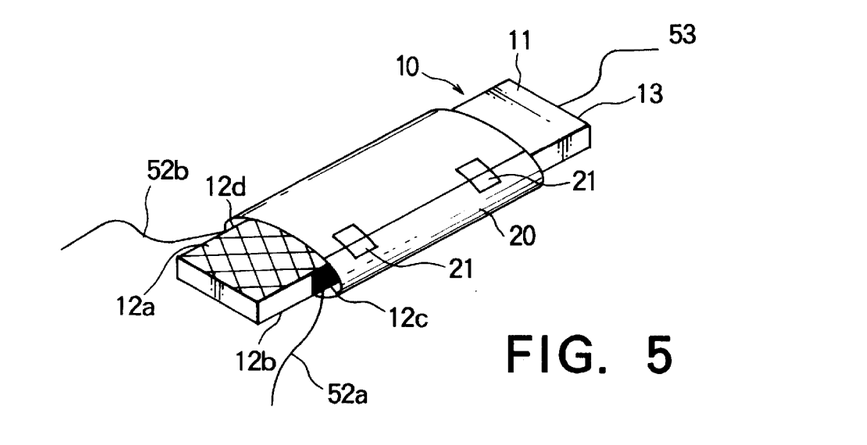
FIG. 5 is a perspective view a piezoelectric transformer device according to one embodiment of the present invention.
Figure 6:
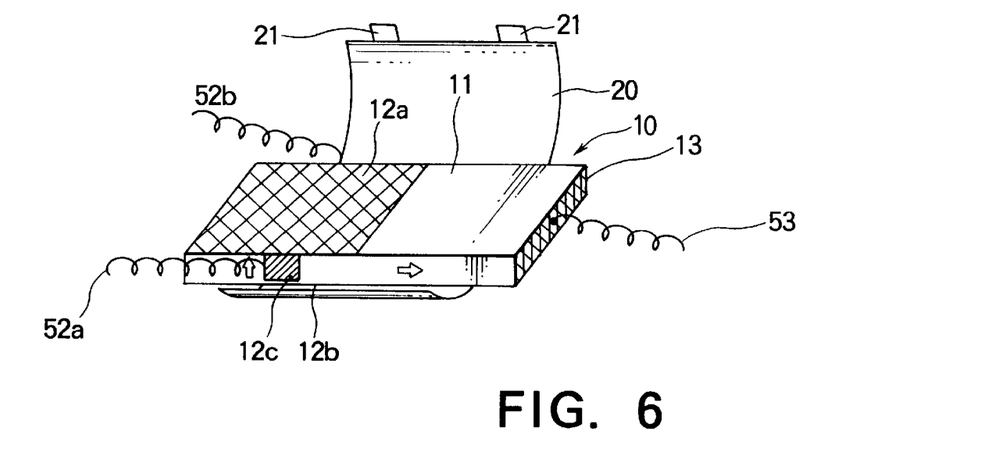
FIG. 6 is a perspective view of the piezoelectric transformer device of FIG. 5 with a wrapping sheet being unwrapped.

Referring to FIGS. 5 and 6, a piezoelectric transformer device according to a first embodiment of this invention is characterized by provision of a wrapping sheet 20 of a soft insulating material such as polyimide, polyamide, polyester and other plastic resin. The wrapping sheet 20 is rolled around a piezoelectric transformer element 10 and primary and secondary lead wires 52 and 53 together and is fixed by adhesive tapes 21 to maintain the rolled condition. The primary and secondary lead wires 52 and 53 are led out and exposed outside the wrapping sheet 20.

The wrapping sheet 20 can be used which has a thickness of about 0.1 mm or less. Thus, the transformer device is small in size and easy in assembling and therefore, low in cost.

The transformer element 10 is similar to the conventional one of FIG. 1 but has side electrodes 12c and 12d as input terminal electrodes connected to primary electrodes 12a and 12b on opposite surfaces of the piezoelectric-ceramic rectangular plate 11 similar to that as shown in FIG. 1. The side terminal electrodes are preferably formed at positions in the vicinity of the vibration nodes of the piezoelectric rectangular plate 11.

It is possible to use the transformer of FIG. 1, which is, in turn, wrapped by the wrapping sheet 20 according to the present invention.

Figure 9:
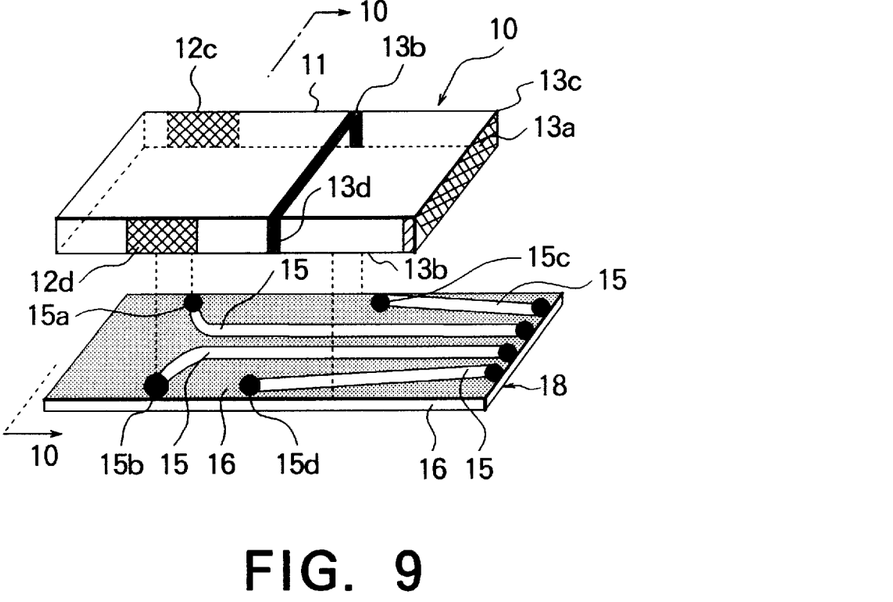
FIG. 9 is an exploded perspective view of the piezoelectric transformer device of FIG. 8 with a wrapping sheet being omitted.
Figure 10:
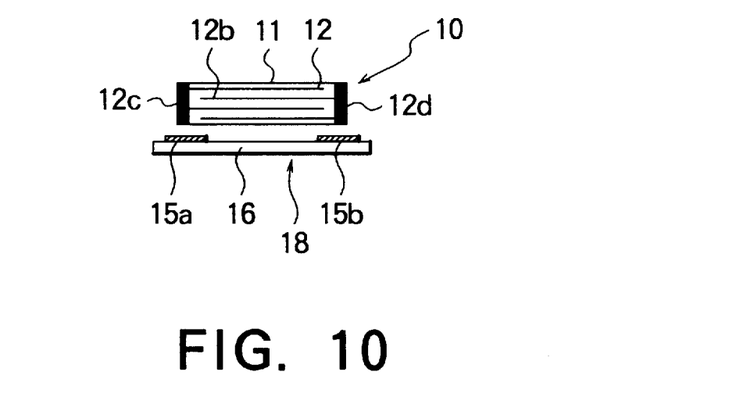
FIG. 10 is a cross-sectional view taken along a line 10—10 in FIG. 9.

It is also possible to use a transformer element 10 as shown in FIGS. 9 and 10 having inner primary electrodes as described hereinafter.

In an example, the piezoelectric ceramic plate 11 is of PZT ceramic and has a size of 40 mm×6 mm×1.5 mm. A paste of Ag is used for the electrodes 12a–12d, and 13.

Figure 7:
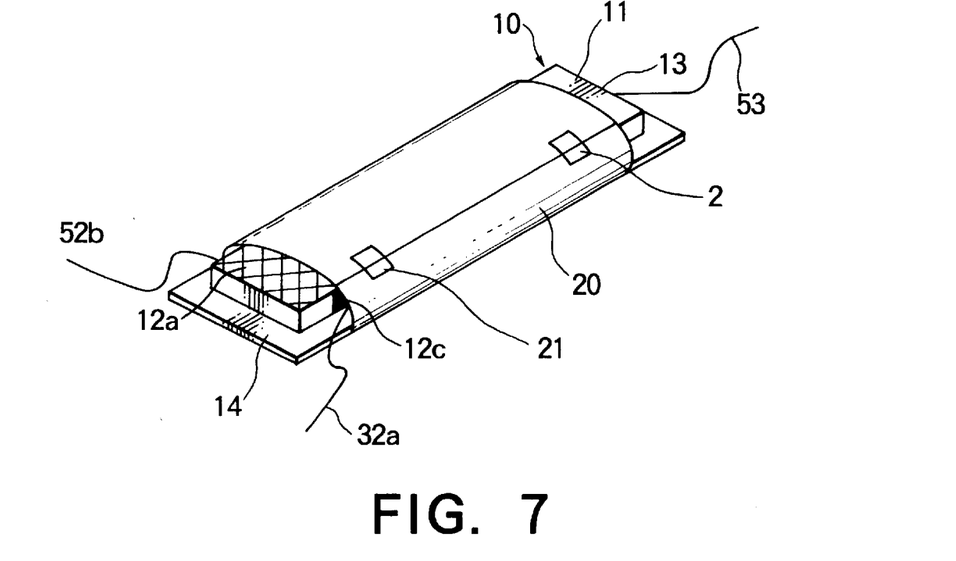
FIG. 7 is a perspective view of a piezoelectric transformer device according to another embodiment of the present invention.

Referring to FIG. 7, a piezoelectric transformer according to a second embodiment of this invention is similar to the embodiment of FIGS. 5 and 6 and further comprises a rectangular-shape substrate or support plate 14 having an upper rectangular surface for mounting the transformer element 10 thereon. The substrate 14 is also wrapped by the wrapping sheet 20 together with the transformer element 10 and lead wires 52 and 53, as shown in the figure.

In the modification, the wrapping sheet 20 and the substrate 14 can be formed in continuous and integral body by molding a plastic resin.

Figure 8:
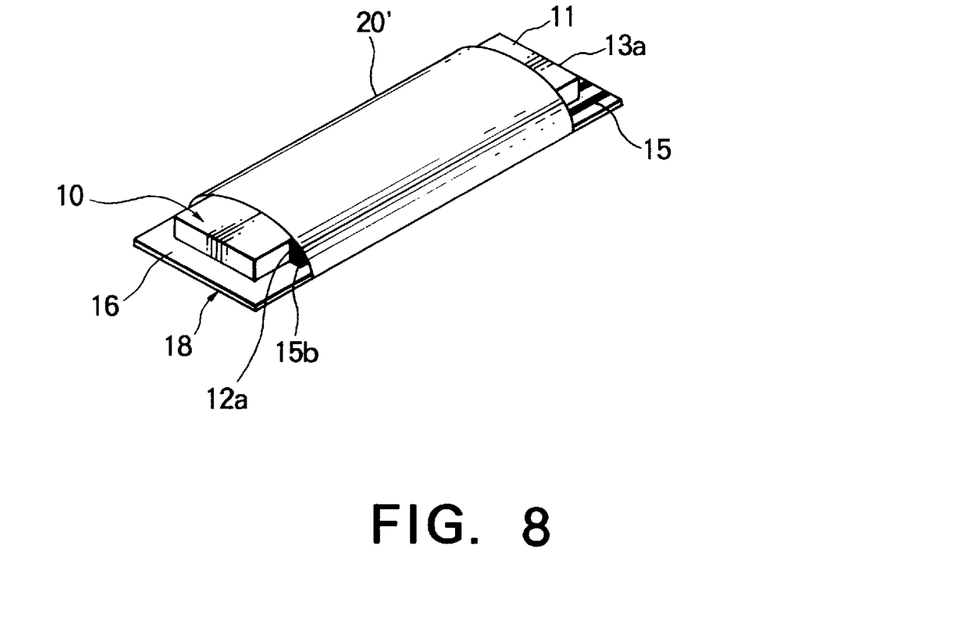
FIG. 8 is a perspective view of a piezoelectric transformer device according to another embodiment of the present invention.

Referring to FIGS. 8 through 10, there is shown a piezoelectric transformer device according to a third embodiment of this invention.

In the shown embodiment, a heat shrinkable tube 20' is used for the wrapping sheet. Further, in place of the primary lead wire 52a and 52b and the secondary lead wire 53, a flexible flat cable or a flexible printed circuit board 18 is used. The flexible flat cable comprises a flexible sheet of a plastic resin and a wiring pattern or conductors 15 are formed to extend in the flexible sheet.

The transformer element 10 and the flexible flat cable 18 are inserted into the heat-shrinkable tube 20' and is heated. Then, the tube 20' is shrunk and wraps and grasps the transformer element 10 and the flexible flat cable 18 together. Therefore, the adhesive tapes 21 are unnecessary to fix the transformer element 10 and the flexible flat cable 18 together.

Referring to FIGS. 9 and 10, the transformer element 10 and the flexible flat cable 18 are described below.

The transformer element 10 has a structure which is similar to one as shown in FIG. 1 but has several differences. The similar portions are represented by the same reference symbols as in FIG. 1. With respect to the differences, a plurality of pairs of primary electrodes 12a and 12b are formed in the half portion of the piezoelectric-ceramic plate 11 as shown in FIG. 10. A pair of input terminal electrodes 12c and 12d are formed on opposite side surfaces of the half portion of the plate 11. One 12c of the input terminal electrodes are connected to the one electrodes 12a of paired primary electrodes, while the other 12d of the input terminal electrodes is connected to the other ones 12b of the paired primary electrodes. Further, an additional secondary electrode 13b is formed on the surface at the middle portion of the plate 11 in addition to the secondary electrode 13a formed on the end surface of the plate 11. This means that the output voltage can be obtained across the secondary electrodes 13a and 13b without one of the primary electrodes being used in common for the secondary side. The secondary electrode 13a and 13b extends onto the side surfaces of the plate to form small side electrodes as output terminal electrodes 13c and 13d.

The flexible flat cable 18 comprises a plurality of conductor strips 15 insulated by and covered with a flexible plastic sheet 16. The conductors strips 15 has connection pads 15a–15d exposed out of the plastic sheet for electrical and mechanical connection with the input terminal electrodes 12c and 12d and 13c and 13d, respectively, by soldering method, when the transformer 10 is mounted on the flexible flat cable 18. The flexible flat cable 18 is also provided with terminal pads (as shown at black circles at right end of the structure 18 in the figure) of conductor strips 15 which can be easily connected with an external circuit.

In use of the transformer device with the flexible flat cable 18 and the wrapping sheet 20', mounting operation onto a circuit board and connecting operation thereto of other circuit elements are readily carried out without troublesome treatment of lead wires.

In an example, a transformer element 10 is formed by forming a plurality of rectangular green sheets of piezoelectric ceramic, printing primary electrode patterns of Ag/Pd on the green sheets, stacking and sintering the green sheets to form a hard rectangular ceramic plate 11 with the primary electrodes 12a and 12b. Thereafter, the input terminal electrodes 12c and 12d, the secondary electrode 13a and 13b with output terminal electrodes 13c and 13d are formed on the plate 11 by firing Ag paste. Then, a flexible flat cable 18 is mounted and connected to the transformer element 10 by wrapping then by the wrapping sheet 20 thereon or by covering them by the heat-shrunk tube 20'.

Figure 11:
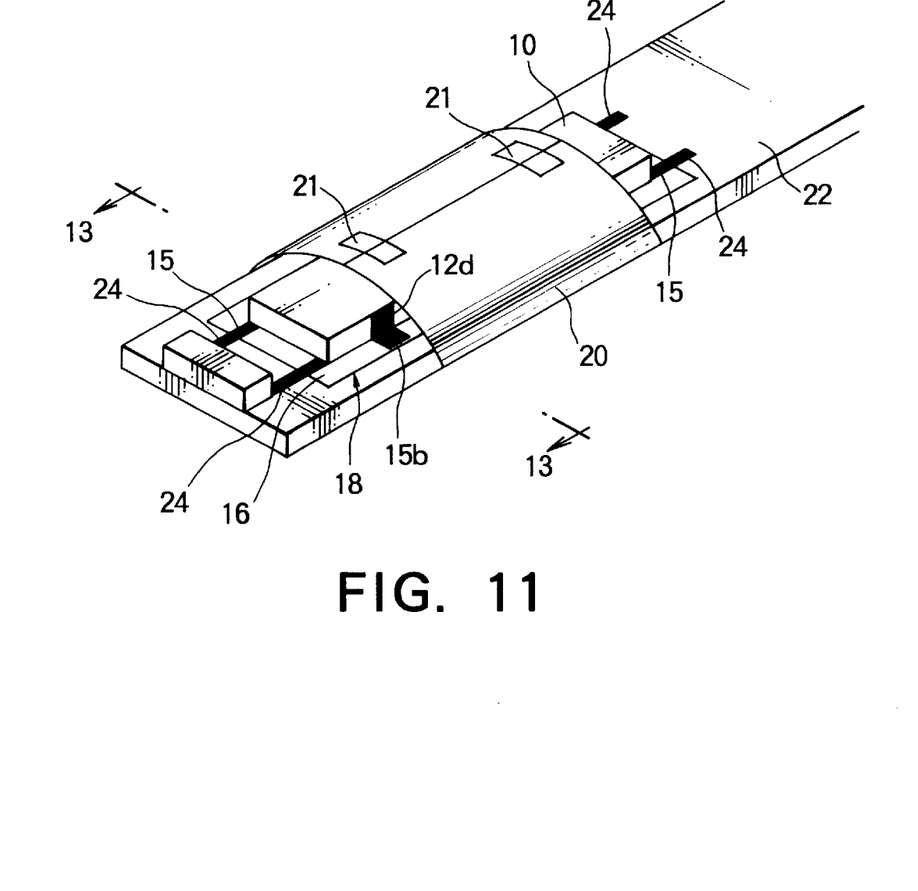
FIG. 11 is a perspective view of an electric power supply device according to one embodiment of the present invention.
Figure 12:
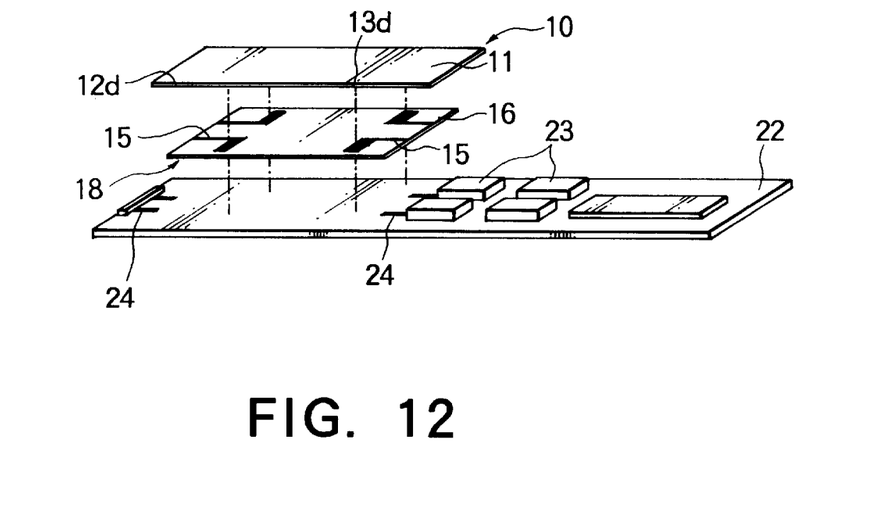
FIG. 12 is an exploded perspective view of the device in FIG. 11 with a wrapping sheet being omitted.

Referring to FIGS. 11 and 12, an electric power supply device using the piezoelectric transformer device according to an embodiment of the present invention comprises a piezoelectric transformer element 10, a flexible flat cable 18, a printed circuit board 22, and a wrapping sheet 20 wrapping them therein.

The transformer element 10 is similar to that as shown in FIGS. 9 an 10. The printed circuit board 22 has circuit elements 23 mounted thereon for composing the electric power supply device in cooperation with the transformer element 10 and a wiring pattern 24 for connecting the transformer element 10 to the circuit elements 23. The flexible flat cable 18 has the conductor pattern 15 which is connected to the wiring pattern when the flexible flat cable 18 is mounted on a transformer mounting region of the printed circuit board 22 together with the transformer element 10.

The wrapping sheet 20 wraps the transformer element 10, the flexible flat cable 18 and the transformer mounting region of the printed circuit board 22 together, and is fixed by the adhesive tapes 21 in the wrapping condition. It is also possible to use the heat-shrinkable tube 20'.

According to the embodiment, the electric power supply device is a reduced thickness such as 2.5 mm in comparison with a thickness of 5 mm of a prior art electric power supply device using a piezoelectric transformer contained in a plastic case. It is provided that the piezoelectric transformer element has a size of 40 mm×6 mm×1.5 mm.

Figure 13:
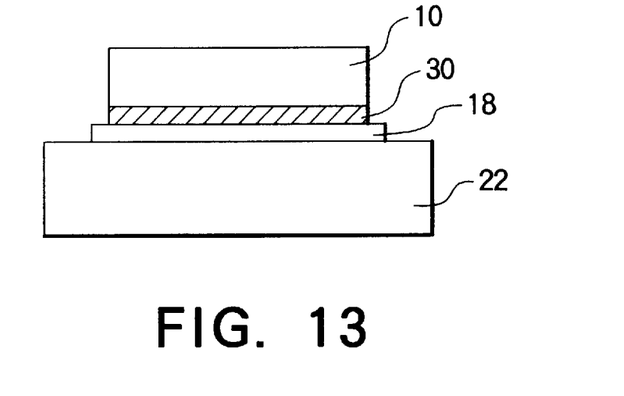
FIG. 13 is a cross-sectional view taken along a line 13—13 in FIG. 11, with the wrapping sheet being omitted.

Referring to FIG. 13, a piezoelectric transformer element 10 and the flexible flat cable 18 can be fixed by silicone adhesive 30 at positions in the vicinity of the vibration nodes of the piezoelectric plate 11. Thus, the piezoelectric transformer element 10 can be supported on the printed circuit board 22 without bad effect to the vibration of the piezoelectric plate 11.

Figure 14:
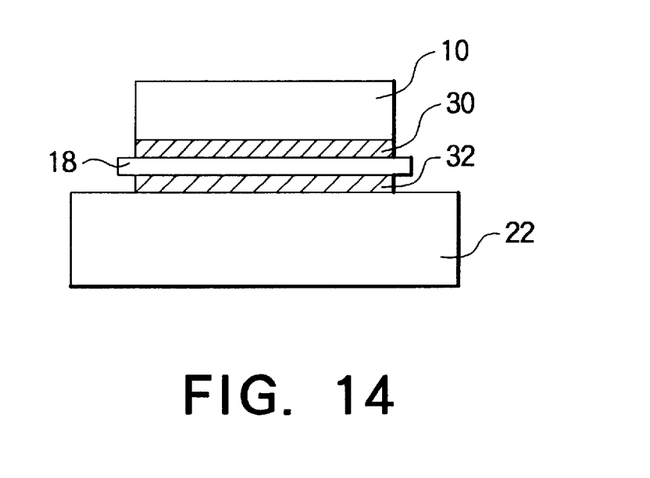
FIG. 14 is a cross-sectional view of a modification similar to FIG. 13.

Referring to FIG. 14, another silicone adhesive layers 32 can be provided between the flexible flat cable 18 and the printed circuit board 22 at the positions in the vicinity of the vibration nodes of the piezoelectric plate 11.

Figure 15:
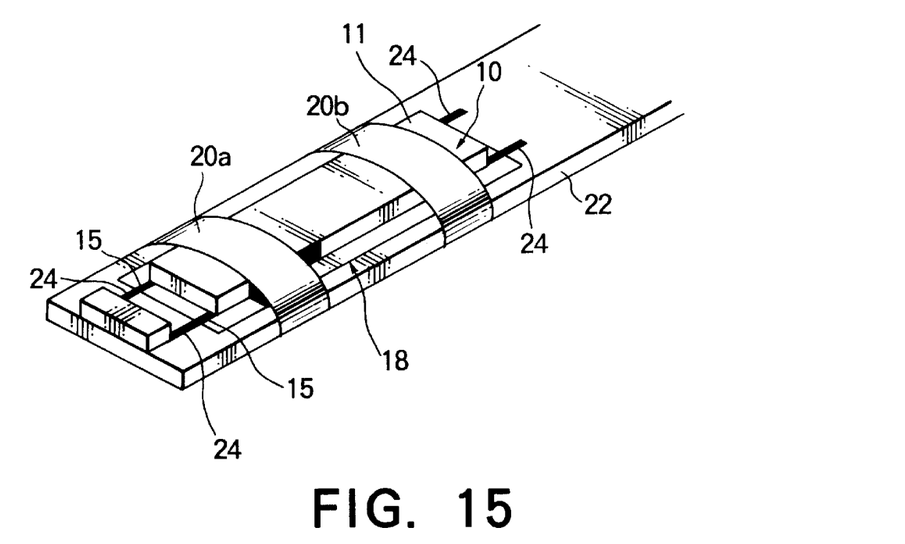
FIG. 15 is a perspective view of an electric power supply device according to a different embodiment of the present invention.
Figure 16:
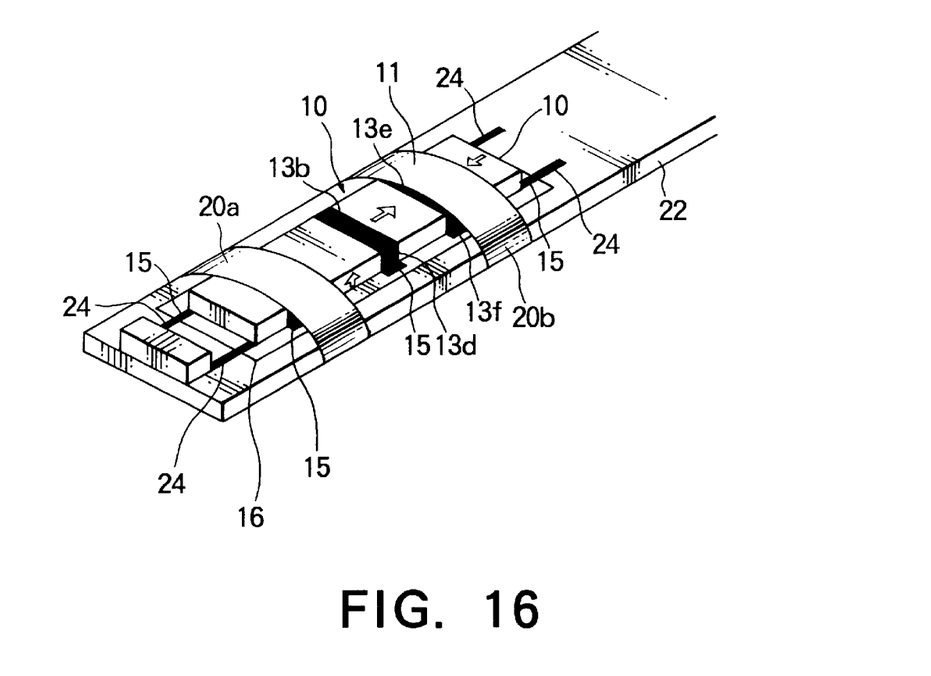
FIG. 16 is a perspective view of an electric power supply device according to another embodiment of the present invention.

Referring to FIGS. 15 and 16, two wrapping bands 20a and 20b are used to cover and grasp the piezoelectric transformer element 10, the flexible flat cable 18, and the transformer mounting portion of the printed circuit board 22 at positions in the vicinity of the vibration nodes of the piezoelectric plate 11. In these embodiments, the wrapping bands 20a and 20b are shown as heat-shrunk tubes. However, the sheet bands can be wrapped and fixed by adhesive tapes in the similar manner as shown in FIG. 5.

In the embodiment of FIG. 16, the piezoelectric transformer element 10 is different from that in FIGS. 11, and 15 in the secondary electrode structure. That is, the secondary electrode structure comprises an end electrode 13a similar to electrode 13 in FIG. 1, a strip electrode 13b at a central portion of the piezoelectric plate 11 similar to electrode 13b in FIG. 9 and another strip electrode 13e formed at a middle point between the electrodes 13a and 13b, that is, at a distance of L/4 from the end electrode 13a, L being a length of the piezoelectric plate 11. The electrode 13e is also provided with a side terminal electrode 13f which is connected to the conductor pattern 15 on the flexible flat cable 18.

In the transformer element, the piezoelectric plate 11 is polarized in the opposite directions at both regions of the electrode 13e as shown by arrows in the figure. That is, the region between electrodes 13b and 13e is polarized in a rightward direction, while the other region between the electrodes 13e and 13a is polarized in a leftward direction. The electrodes 13b and 13a are grounded, and the output is taken out between the electrode 13e and the ground. In this structure, the high output voltage can be obtained.

The electrode 13e at the high voltage is covered by the wrapping band 20b of the insulator sheet material.

The electric power supply devices of FIG. 11, FIG. 13, and FIG. 16 were produced with the internal electrodes of 10 layers and subjected to evaluation tests.

In evaluation tests, an input voltage of 20V was applied to each of the electric power supply devices and the output voltage and current and the temperature were measured. The measured data are demonstrated in Table 1.

Further, each of the transformers were subjected to an aging test by use of the same input voltage. The output voltage and current and the temperature were measured at start, after 500 hours, and 1,000 hours. The measured data are shown in Table 2.

TABLE 1

| Device | with Case | Embodiments with FPC | | |
|---|---|---|---|---|
| | | FIG. 11 | FIG. 13 | FIG. 16 |
| Qm | 705 | 720 | 710 | 725 |
| Output Voltage (Vpp) | 1410 | 1430 | 1415 | 1437 |
| Output Current (mA) | 5.8 | 6.1 | 6.0 | 6.2 |
| Temperature (degree C) | 32 | 31 | 33 | 31 |

TABLE 2

| Aging Time (Hour) | | 0 | 500 | 1000 |
|---|---|---|---|---|
| Prior Art Device with Case | NG | 0 | 1 | 2 |
| Embodiments | G | 50 | 49 | 48 |
| FIG. 11 | NG | 0 | 0 | 0 |
| | G | 50 | 50 | 50 |
| FIG. 13 | NG | 0 | 0 | 0 |
| | G | 50 | 50 | 50 |
| FIG. 16 | NG | 0 | 0 | 0 |
| | G | 50 | 50 | 50 |

NG represents that device makes noise by vibration leakage, G represents good device without such noise.

NG represents that device makes noise by vibration leakage, G represents good device without such noise.

What is claimed is:

1. A piezoelectric transformer device comprising:
   a piezoelectric transformer element further comprising a piezoelectric rectangular plate having an input region and an output region, primary electrode means formed on said input region of said rectangular plate for receiving a driving voltage as a primary voltage to drive vibration of said rectangular plate by the piezoelectric effect, and secondary electrode means formed on the output region of said rectangular plate for taking out a secondary voltage generated by the vibration of said rectangular plate due to the piezoelectric effect;
   primary lead means connected to said primary electrode means for feeding said driving voltage to said primary electrode means;
   secondary lead means connected to said secondary electrode means for leading out said secondary voltage; and
   wrapping means of soft insulating sheet material wrapping and grasping said piezoelectric transformer element, said primary lead means, and said secondary lead means together therein, said primary lead means and said secondary lead means being led out of said cover sheet, wherein said wrapping means comprises a cover sheet rolled to cover said piezoelectric transformer element, said primary lead means, and said secondary lead means together therewith, and adhesive tape means fixing said cover sheet in the rolled state.

2. A piezoelectric transformer device as claimed in claim 1, wherein said cover sheet is of one selected from polyimide, polyamide and polyester plastic resin.

3. A piezoelectric transformer device as claimed in claim 1, which further comprises a rectangular substrate of an insulating material on which said piezoelectric transformer element is mounted, said substrate being wrapped together with said piezoelectric transformer element in said wrapping means.

4. A piezoelectric transformer device as claimed in claim 1, which further comprises a flexible insulating sheet in which a plurality of pattern conductors are formed as said primary and said secondary lead means to extend therein to thereby form a flexible flat cable, said flexible flat cable being wrapped together with said piezoelectric transformer element in said wrapping means.

5. A piezoelectric transformer device as claimed in claim 4, wherein said wrapping means and said flexible insulating sheet are of a continuous integral sheet made of a soft insulating sheet material.

6. A piezoelectric transformer device as claimed in claim 4, said piezoelectric rectangular plate having opposite side surfaces and an end surface, wherein said primary electrode means includes input terminal electrode means formed on said side surfaces and connected to said primary lead means, and said secondary electrode means includes output terminal electrode means formed on at least one of said side surfaces and said end surface and being connected to said secondary lead means.

7. A piezoelectric transformer device as claimed in claim 6, which further comprises a rectangular substrate of an insulating material on which said piezoelectric transformer element is mounted together with said flexible flat cable, said substrate being wrapped together with said piezoelectric transformer element and said flexible flat cable in said wrapping means.

8. A piezoelectric transformer device as claimed in claim 7, the vibration of said rectangular plate having a plurality of vibration nodes, wherein said piezoelectric transformer element is fixed by adhesive agent to said flexible flat cable in the vicinity of said vibration nodes of said rectangular plate.

9. A piezoelectric transformer device as claimed in claim 8, wherein said flexible flat cable and said rectangular substrate are fixed together in the vicinity of said vibration nodes of said rectangular plate.

10. An electric power supply device comprising a piezoelectric transformer device, other circuit elements to be connected to said piezoelectric transformer device, and a circuit board having a transformer region on which said piezoelectric transformer device is mounted, an adjacent region on which said other circuit elements are mounted, and a wiring pattern formed thereon to connect said piezoelectric transformer device with said other circuit elements, wherein said piezoelectric transformer comprises:

a piezoelectric transformer element comprising a piezoelectric rectangular plate having an input region and an output region, primary electrode means formed on said input region of said rectangular plate for receiving a driving voltage as a primary voltage to drive vibration of said rectangular plate by the piezoelectric effect, and secondary electrode means formed on the output region of said rectangular plate for taking out a secondary voltage generated by the vibration of said rectangular plate due to the piezoelectric effect;

primary lead means connected to said primary electrode means for feeding said driving voltage to said primary electrode means, said primary lead means being connected to said wiring pattern; and secondary lead means connected to said secondary electrode means for leading out said secondary voltage, said secondary lead means also being connected to said wiring pattern;

and wherein said electric power supply device further comprises:

wrapping means of soft insulating sheet material wrapping and grasping said piezoelectric transformer element, said primary lead means, said secondary lead means, and said transformer region of said circuit board together therein.

11. An electric power supply device as claimed in claim 10, wherein said wrapping means comprises a cover sheet rolled to cover said piezoelectric transformer element, said primary lead means, said secondary lead means, and said transformer region of said circuit board together therewith, and adhesive tape means fixing said cover sheet in the rolled state.

12. An electric power supply device as claimed in claim 11, wherein said cover sheet is of one selected from polyimide, polyamide and polyester plastic resin.

13. An electric power supply device as claimed in claim 10, wherein said wrapping means is made of a thermoshrinking material and shrunk to wrap and grasp said piezoelectric transformer element, said primary lead means, said secondary lead means, and said transformer region of said circuit board together therein.

14. An electric power supply device as claimed in claim 10, which further comprises a flexible insulating sheet in which a plurality of pattern conductors are formed as said primary and said secondary lead means to extend therein to thereby form a flexible flat cable.

15. An electric power supply device as claimed in claim 14, said piezoelectric rectangular plate having opposite side surfaces and an end surface, wherein said primary electrode means includes input terminal electrode means formed on said side surfaces and connected to said primary lead means, and said secondary electrode means includes output terminal electrode means formed on at least one of said side surfaces and said end surface and being connected to said secondary lead means.

16. An electric power supply device as claimed in claim 15, the vibration of said rectangular plate having a plurality of vibration nodes, wherein said piezoelectric transformer element is fixed by adhesive agent to said flexible flat cable in the vicinity of said vibration nodes of said rectangular plate.

17. An electric power supply device as claimed in claim 16, wherein said flexible flat cable and said transformer region of said circuit board are fixed together in the vicinity of said vibration nodes of said rectangular plate.

18. An electric power supply device as claimed in claim 15, the vibration of said rectangular plate having a plurality of vibration nodes, wherein said wrapping means comprises a plurality wrapping members which are provided to wrap and grasp said piezoelectric transformer element, said primary lead means, said secondary lead means, and said transformer region of said circuit board together therein at positions corresponding to said plurality of vibration nodes of said rectangular plate, respectively.

19. An electric power supply device as claimed in claim 18, wherein said input and said output terminal electrode means are formed in the vicinity of said vibration nodes, respectively.

* * * * *